(12) United States Patent
Suetinov et al.

(10) Patent No.: US 9,124,229 B2
(45) Date of Patent: Sep. 1, 2015

(54) METHODS AND SYSTEMS TO PROVIDE LOW NOISE AMPLIFICATION

(71) Applicant: Intel Corporation, Santa Clara, CA (US)

(72) Inventors: Viatcheslav I. Suetinov, Swindon (GB); Keith Pinson, Swindon (GB); Nicholas P. Cowley, Wroughton (GB)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/800,811

(22) Filed: Mar. 13, 2013

(65) Prior Publication Data
US 2014/0266439 A1    Sep. 18, 2014

(51) Int. Cl.
*H03F 3/45* (2006.01)

(52) U.S. Cl.
CPC .................................. *H03F 3/45237* (2013.01)

(58) Field of Classification Search
CPC .............................. H03F 3/45; H03F 3/45237
USPC .................................. 330/254, 260, 261, 257
See application file for complete search history.

(56) References Cited

U.S. PATENT DOCUMENTS

| 3,965,436 | A * | 6/1976 | Dixon | 330/254 |
| 6,703,898 | B2 * | 3/2004 | Renous | 330/253 |
| 7,358,810 | B2 * | 4/2008 | Kwon et al. | 330/253 |
| 7,834,704 | B2 * | 11/2010 | Hijikata et al. | 330/305 |

* cited by examiner

*Primary Examiner* — Henry Choe
(74) *Attorney, Agent, or Firm* — Garrett IP, LLC

(57) ABSTRACT

An amplifier, including a voltage-to-current converter (V2I) to control an output current based on an input voltage, resistive degeneration circuitry to reduce baseband gain of the voltage-to-current converter, capacitive degeneration circuitry to increase passband gain of the voltage-to-current converter, and impedance control circuitry to compensate for negative input impedance of the capacitive degeneration circuitry. The V2I may include series-connected complimentary V2Is. The impedance control circuitry may include resistive negative feedback to provide a real part of input impedance, which may increase a frequency range for which the amplifier is linear. Capacitive degeneration and associated phase compensation may increase a frequency range for which the resistive feedback is negative. The amplifier may be configured as a single-input/single-output system and/or as a differential system.

21 Claims, 7 Drawing Sheets

METHODS AND SYSTEMS TO PROVIDE LOW NOISE AMPLIFICATION

BACKGROUND

Design and manufacture of a radio-frequency (RF) direct conversion receiver in a complementary metal-oxide semiconductor (CMOS) material raises challenges, including suppression of flicker noise of active components while providing sufficient sensitivity. The challenges are more complicated when an ultra-high speed digital technological process is used for a receiver implementation.

Flicker noise may arise in a baseband channel in several ways.

Flicker noise may be frequency up-converted, or mixed-up, by a strong blocker in a low-noise amplifier (LNA) due to second order non-linearity of the LNA. Up-converted flicker noise may pollute a noise floor of the LNA around the blocker frequency.

Flicker noise may arise in a conventional mixer circuit when mixer transistors generate noise directly at baseband.

LNA transistors may generate flicker noise, which may directly feed through to mixer outputs. LNA-originated flicker noise may be more pronounced when the LNA has relatively high gain at baseband.

While flicker noise may be reduced with on-die or on-chip inductors to provide resonant loads, on-die inductors are relatively bulky, radiate magnetic and electrostatic noise, and may necessitate relatively high bias currents due to relatively low impedance of corresponding resonant loads. For relatively low resistivity substrates, such as those used in ultra-high speed digital processes, it may also be difficult to accommodate relatively high-Q inductors on-die.

Figure 1:
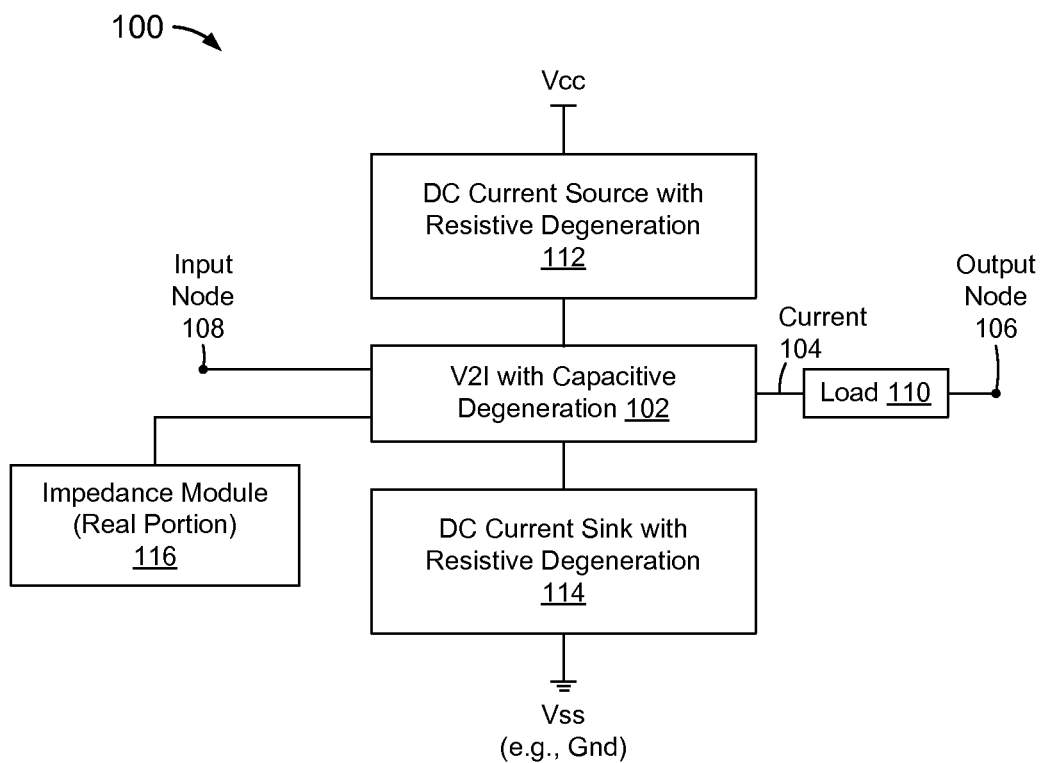
FIG. 1 is a block diagram of an amplifier, including a voltage-to-current converter (V2I) 102, resistive degeneration to reduce baseband gain, capacitive degeneration to increase passband gain, and an impedance module to compensate for negative input impedance of the capacitive degeneration.

In the drawings, the leftmost digit(s) of a reference number identifies the drawing in which the reference number first appears.

DETAILED DESCRIPTION

The term "baseband," as used herein, refers to relatively low frequencies, which may include frequencies within a first frequency range or band bounded at a lower end by zero Hertz (Hz).

The term "passband," as used herein, refers to a second frequency range or band, above baseband, for which an amplifier is to amplify or operate substantially linearly. Passband may also be referred to herein as a frequency band of interest, and may include a radio frequency (RF).

The term, "ultra-high speed," as used herein, refers to a digital technological process in which dimensions of one or more transistor are in a range of approximately 20 to 40 nanometers (nm), or smaller, which may result in relatively high flicker noise.

FIG. 1 is a block diagram of an amplifier 100, including a voltage-to-current converter (V2I) 102, a DC current source 112, and a DC current sink 114.

V2I 102 includes voltage-controllable circuitry to control current 104 from DC current source 112 to an output node 106, and from output node 106 to DC current sink 114, based on an input voltage at an input node 108.

By convention used herein, DC current flows from Vcc (+) to Vss (e.g, 0 Volts or ground). DC current source 112 and DC current sink 114 may be interchanged depending upon convention and process technology.

Amplifier 100 further includes degeneration circuitry, which may be configured to filter flicker noise and/or to control gain. Degeneration circuitry may include resistive degeneration circuitry, capacitive degeneration circuitry, and combinations thereof. Degeneration circuitry may be implemented within V2I 102, DC current source 112, and/or DC current sink 114. In the example of FIG. 1, DC current source 114 and DC current sink 112 each include resistive degeneration circuitry, and V2I 102 includes capacitive degeneration circuitry. Methods and systems disclosed herein are not, however, limited to this example.

Degeneration circuitry may be utilized or implemented in single-ended and/or differential amplifier architectures.

Resistive degeneration circuitry may be configured to reduce gain of amplifier 100 at baseband, and may be configured to progressively reduce gain for progressively lower baseband frequencies and/or to substantially eliminate gain at or near zero Hz (DC). Resistive degeneration circuitry may be configured to filter or reduce relatively low-frequency noise, such as flicker. Resistive degeneration circuitry may be configured to reduce gain at baseband when load(s) are non-resonant at baseband.

DC current sink 114 may have relatively low input impedance at baseband or DC, and relatively high input impedance at passband (e.g., RF), and may serve as a load. An example amplifier is presented further below in which a DC current sink is configured to serve as a load for an n-channel V2I. Amplifier 100 may include other load(s) and/or load condition(s), illustrated generally here as a load 110.

Capacitive degeneration circuitry may be configured to improve or increase gain at passband. Capacitive degeneration circuitry may be configured to control impedance between a node of amplifier 100 and an operating voltage Vcc and/or a voltage reference Vss (e.g., ground), and may be configured to provide progressively higher impedance at progressively lower baseband frequencies to increasingly short a node(s) of amplifier 100 to ground.

Baseband gain of amplifier 100 may be defined and/or controlled in part by degenerative resistors and by transconductance of input transistors of V2I 102. Passband gain of amplifier 100 may be defined and/or controlled in part by a combination of transconductance of the input transistors and degenerative impedance (resistance and capacitive). Examples are provided further below with reference to FIG. 4.

Amplifier 100 further includes an impedance module 116 to control or manage input impedance of amplifier 100. Impedance module 116 may be configured to compensate for negative input impedance of the capacitive degeneration circuitry, and may be configured to provide a real portion of the input impedance of amplifier 100.

Amplifier 100, and/or portions thereof, may be implemented and/or configured as described in one or more examples below. Amplifier 100 is not, however, limited to the examples below.

Figure 2:
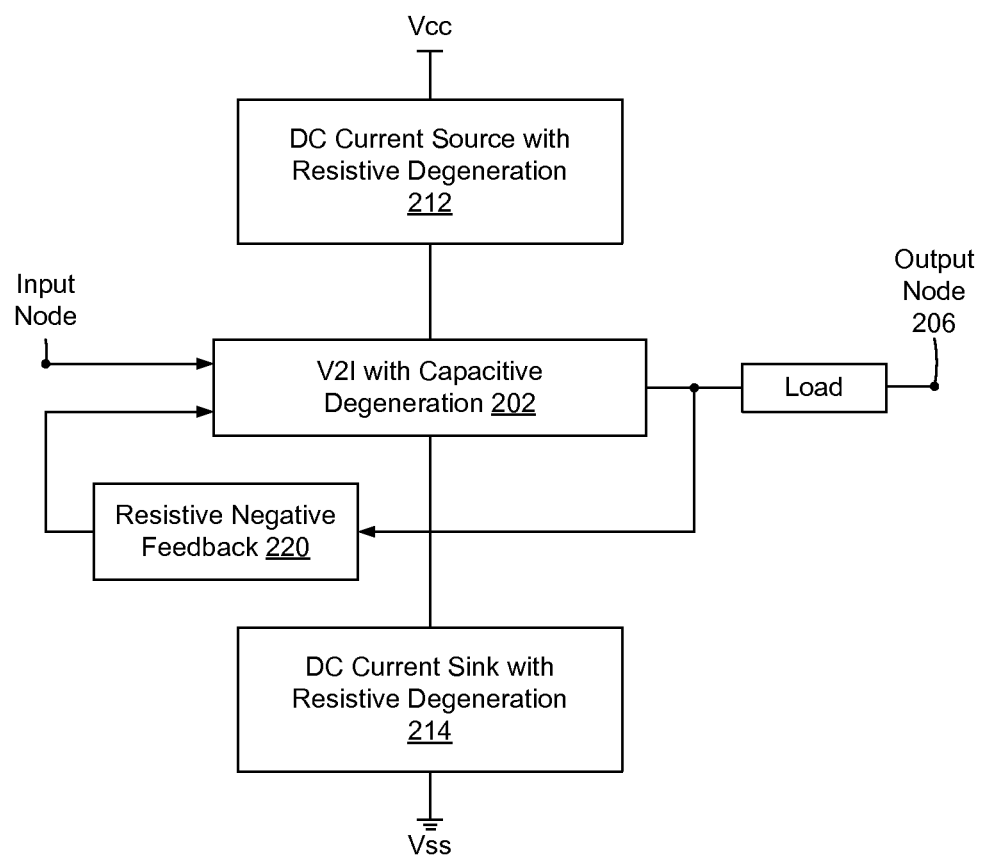
FIG. 2 is a block diagram of another amplifier including resistive negative feedback to compensate for negative input impedance.

FIG. 2 is a block diagram of an amplifier 200, including a V2I 202, a DC current source 212 and a DC current sink 214, such as described above with reference to FIG. 1.

Amplifier 200 further includes resistive negative feedback circuitry 220, which may be configured to compensate for negative input impedance of capacitive degeneration circuitry within V2I 202, and/or to provide a real portion of the input impedance of amplifier 200. Resistive negative feedback circuitry 220 may represent an example embodiment of impedance module 116 in FIG. 1, and may be referred to herein as a resistive negative feedback path.

Resistive negative feedback circuitry 220 may include a transistor-based diode configuration with resistive feedback, such as described below with reference to FIG. 4.

Figure 3:
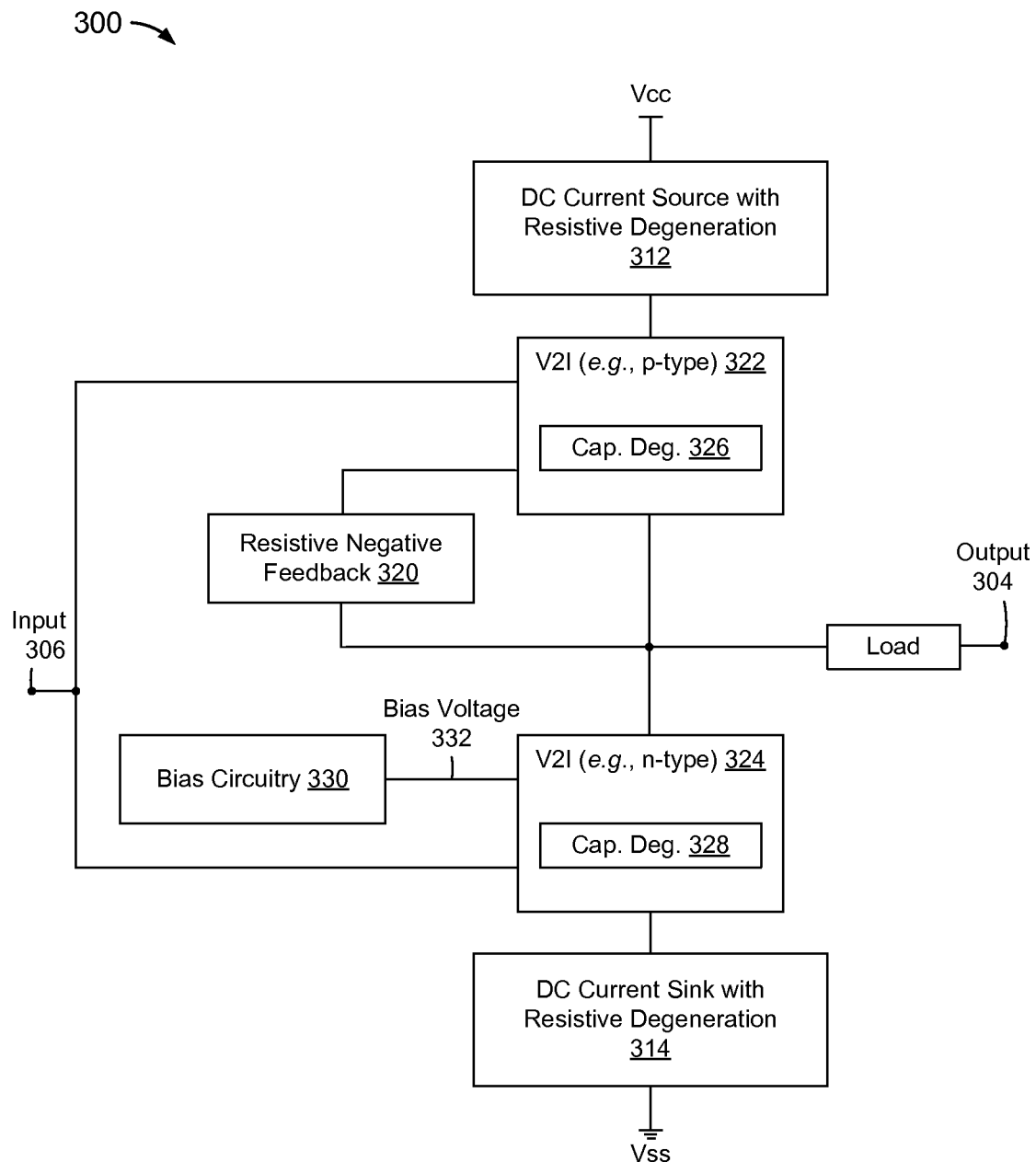
FIG. 3 is a block diagram of another amplifier, including first and second series-connected V2Is, and bias circuitry to control DC current.

FIG. 3 is a block diagram of an amplifier 300, including a DC current source 312, a DC current sink 314, such as described above with reference to FIG. 1, and resistive negative feedback circuitry 320, such as described above with reference to FIG. 2.

Amplifier 300 further includes first V2I 322 to control AC or passband current from Vcc to an output 306, and a second V2I 324 to control AC or passband current from output 304 to Vss, based on an input voltage at an input 306.

The example arrangement of V2Is 322 and 324 in FIG. 3 may be referred to herein as a series and/or complimentary configuration.

V2Is 322 and 324 may be implemented with p-channel devices and/or n-channel devices. Based characteristics of p-channel devices and n-channel devices, and conventions used herein, V2I 322 may include one or more voltage-controllable p-channel devices, and V2I 324 may include one or more voltage-controllable n-channel devices. In this example, V2Is 322 and 334 may be referred to herein as p-channel and n-channel V2Is, respectively. Methods and systems disclosed herein are not, however, limited to these examples.

P-channel V2I 324 and n-channel V2I 326 may each include corresponding capacitive degeneration circuitry 326 and 328, such as to improve or increase passband gain.

DC or baseband current control is now described. Baseband current may be controlled with respect to Vcc and/or with respect to Vss. In FIG. 3, amplifier 300 includes bias circuitry 330 to provide a bias voltage 332 to V2I 324 to control baseband current to Vss (i.e., through V2I 324).

Bias circuitry 330 may include a current mirror and a ladder to provide a reference voltage to the current mirror. The ladder may be implemented with transistors, alone or in combination with resistive degeneration. Resistive degeneration may be useful to increase accuracy and/or decrease noise.

For a given process technology, such as a digital ultra-high speed process technology, n-channel devices may have lower gain and better noise properties than p-channel devices. In such a situation, the current mirror may be implemented with n-channel devices, and may be implemented in combination with resistive degeneration. Example current mirrors and ladders are provided further below.

An n-channel V2I 324 may further include one or more n-channel cascode devices to increase a gain of V2I 324 to that of a p-channel V2I 323.

An amplifier as disclosed herein may be implemented or configured with single-ended or differential inputs, and single-ended or differential outputs.

Figure 4:
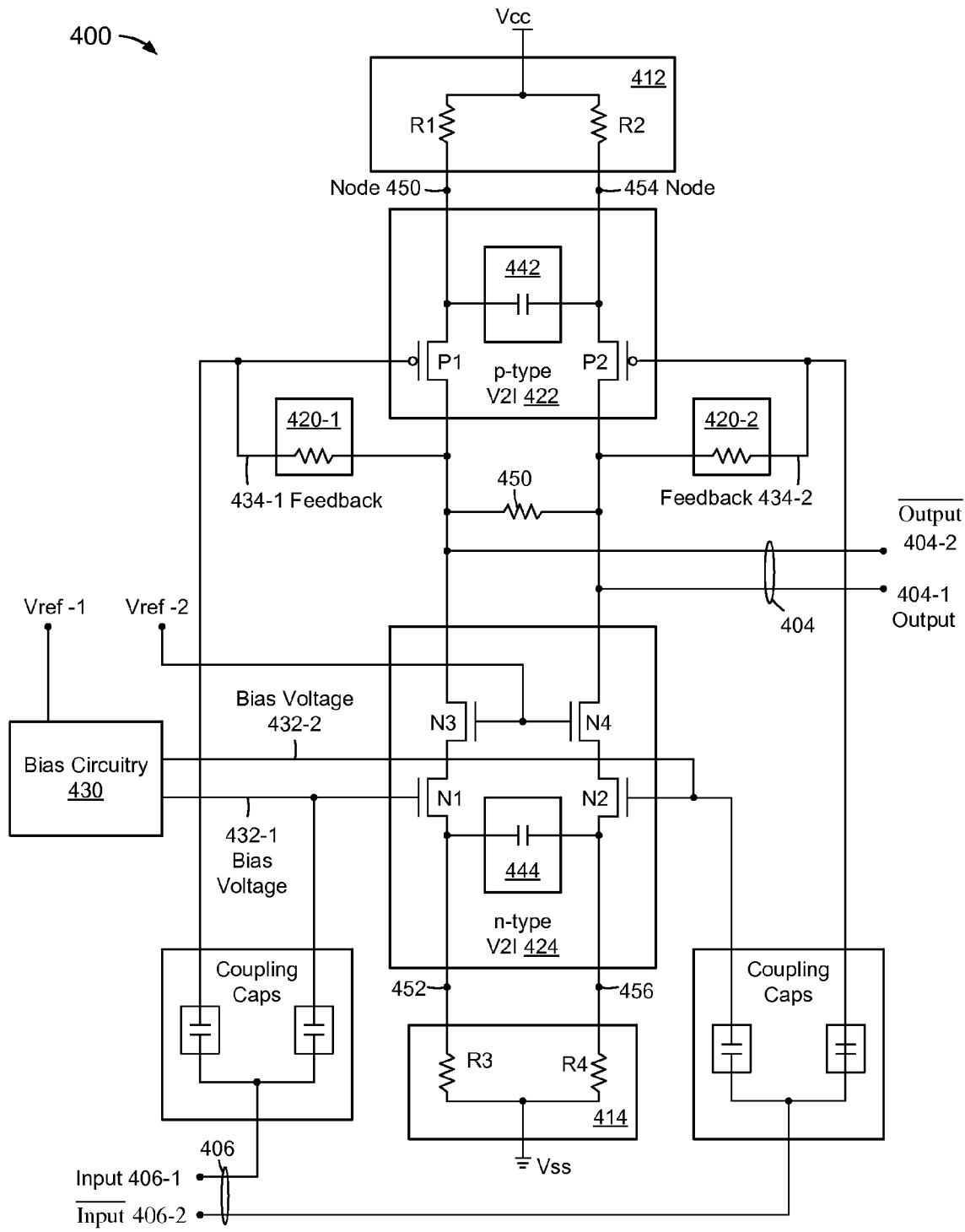
FIG. 4 is a circuit diagram of a differential amplifier including first and second V2I, degenerative resistors to reduce baseband gain, degenerative capacitors to increase passband gain, negative feedback paths to compensate for negative input impedance of the degenerative capacitors, and bias circuitry to control DC current.

FIG. 4 is a circuit diagram of a differential amplifier 400, including differential inputs 406-1 and 406-2, and corresponding differential outputs 404-1 and 404-2. Amplifier 400 may be referred to herein as a fully differential amplifier and/or fully balanced amplifier.

Amplifier 400 includes first and second V2Is 422 and 424, respectively. V2I 422 includes voltage-controllable p-channel devices P1 and P2, and may be referred to herein as p-channel V2I 422. V2I 424 includes voltage-controllable n-channel devices N1 and N2, and may be referred to herein as n-channel V2I 424.

Devices P1, P2, N1/N3, and N2/N4 are configured to operate within active regions of the devices, such that the devices function as controllable current sources. When operating within the active regions, the current through each device is function of a corresponding gate-source voltage ($V_{gs}$) and transconductance ($g_m$). The current may be expressed as:

$$I = V_{gs} * g_m \qquad \text{EQ. (1)}$$

When a resistor is placed between a source node of a transistor and a voltage supply or reference (e.g., between Vcc and a source node of P1 or P2, or between Vss and a source node of N1 or N2), the input voltage at input 406 is distributed between the gate-source of the device and the resistor. This decreases transconductance to $g_{mr}$, which may be expressed as:

$$g_{mr} = g_m / (1 + g_m * R) \qquad \text{EQ. (2)}$$

Such a resistor may be used to decrease gain at baseband and to decrease noise generated at the transistor output (e.g., drain), and is thus referred to as a degenerative resistor.

In FIG. 4, amplifier 400 includes a DC current source 412 having degenerative resistors R1 and R2, and devices P1 and P2 are operable to control current from resistors R1 and R2 to output nodes 404.

Amplifier 400 further includes a DC current sink 414 having degenerative resistors R3 and R4, and devices N1 and N2 are operable to control current to resistors R3 and R4 from output nodes 404.

To increase passband or AC gain, a capacitor may be used to decrease AC voltage drop across a degeneration component. In FIG. 4, differential amplifier 400 includes a capacitor 442 across source nodes of devices P1 and P2, and a capacitor 444 across source nodes of devices N1 and N2.

Resistors R1 and R2 reduce baseband transconductance of V2I 422, while capacitor 422 increases passband transconductance of V2I 422. The difference between baseband and passband transconductance is related to the resistance values of R1 and R2 and the capacitive value of degenerative capacitor 442. Upper limit resistance values for R1 and R2 may be based on, or constrained by a DC voltage drop across resistors R1 and R2. The capacitive value of degenerative capacitor 442 may be optimized with respect to, or balanced between passband gain and flicker noise suppression.

Similarly, resistors R3 and R4 reduce baseband transconductance of V2I 424, while capacitor 424 increases passband transconductance of V2I 424.

When a positive input voltage is applied to differential inputs 406, differential current in devices P1 and P2 decreases, and differential current in devices N1 and N2 increases. Devices P1 and N1 may be referred to as complementary devices relative to one another. Similarly, devices P2 and N2 may be referred to as complementary devices relative to one another. Because these complimentary devices are connected in series, total amplifier transconductance of amplifier 400 is a sum of transconductance of devices P1, P2, N1, and N2, with correction on resistive/capacitive degeneration.

Amplifier 400 further includes differential resistive negative feedback paths to compensate for negative input impedance of degenerative capacitors 442 and 444. The resistive negative feedback paths may be configured to provide a real portion of an input impedance of amplifier 400. In FIG. 4, the resistive negative feedback paths include corresponding resistors 420-1 and 420-2, to provide corresponding feedback voltages 434-1 and 434-2. In FIG. 4, feedback voltages 434 are used to bias gate nodes of corresponding devices P1 and P2.

Amplifier 400 further includes bias circuitry 430, configured in combination with n-channel V2I 424 to control DC current from Vss. In FIG. 4, bias circuitry 430 is configured to bias devices N1 and N2 with corresponding bias voltages 432-1 and 432-1, based on a reference voltage Vref-1. Bias circuitry 430 may include a current mirror, such as described above with reference to FIG. 3 and/or as described further below with reference to FIG. 5.

N-channel V2I 424 may include cascode devices N3 and N4 to increase gain of V2I 424 and/or to decrease input capacitance of V2I 424. Cascode devices N3 and N4 may be useful, for example, where devices P1 and P2 provide higher gain than devices N1 and N2, in which case cascode devices N3 and N4 may be configured to increase gain of circuitry V2I 424 to equal the gain of V2I 422. Cascode devices N3 and N4 may be biased with a voltage Vref-2.

In the example of FIG. 4, feedback resistor 420-1 is configured to provide feedback 434-1 from the drain of device P1 to the gate of device P1. Similarly, feedback resistor 420-2 is configured to provide feedback 434-2 from the drain of device P2 to the gate of device P2. These configurations may be referred to herein as transistor-based diode configurations with resistive feedback.

Transistor-based diode configurations with resistive feedback act as diodes at baseband and as resistive loads at passband. Transistor-based diode configurations with resistive feedback may be configured to act as non-resonant resistive loads at baseband, which may permit filtering of low frequency noise, such as flicker. Due to capacitive degeneration, transistor-based diode configurations with resistive feedback may add relatively little or insignificant delay, and may improve input impedance.

In another embodiment, resistive negative feedback may be provided to the gates of devices P1 and P2 from outputs of corresponding cascode devices, such as described above with respect to V2I 424.

Amplifier 400 may include a load 450 between outputs 404-1 and 404-2 to reduce gain of amplifier 400 independent of frequency. Load 450 may include a fixed resistance or a variable resistance. A variable resistance may include multiple selectable resistors, connectable in parallel, where each additional selected resistor decreases the resistance of load 450, which decreases gain of amplifier 402.

Figure 5:
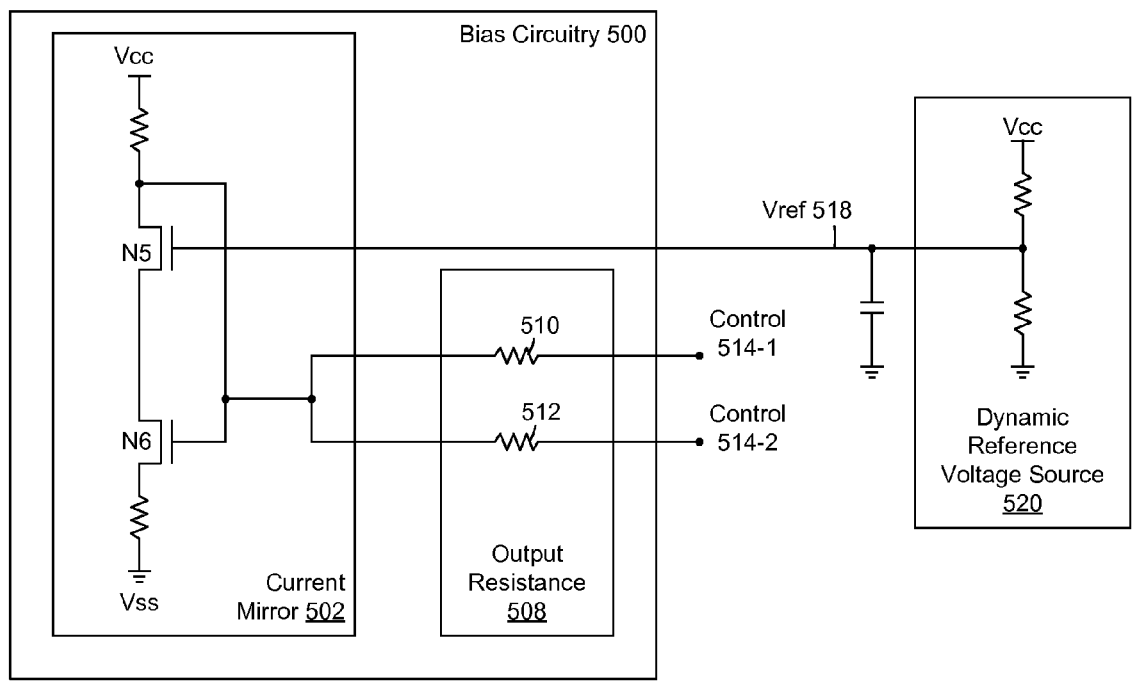
FIG. 5 is circuit diagram of bias circuitry to provide bias voltages based on a reference voltage, and a dynamic reference voltage source to control the reference voltage based on an operating voltage.

FIG. 5 is circuit diagram of bias circuitry 500 and a reference voltage source 520 to provide a reference voltage Vref 518 to bias circuitry 500. Bias circuitry 500 may represent an example implementation of bias circuitry 330 in FIG. 3 and/or bias circuitry 440 in FIG. 4. Reference voltage Vref 518 may represent an example of reference voltage Vref in FIG. 3 and/or Vref-1 in FIG. 4.

Bias circuitry 500 includes a current mirror 502 and resistors 510 and 512 to provide bias voltages 514-1 and 514-2 based primarily on Vcc and in part on a reference voltage Vref 518. Resistors 510 and 512 may be useful to prevent shunting of input voltage at 406 in FIG. 4, and/or to separate or filter noise generated by current mirror 502, such as where current mirror 502 is manufactured or fabricated with a relatively small-scale process technology.

In FIG. 5, reference voltage source 520 is configured as a dynamic reference voltage source 520 to control reference voltage Vref 518 based on an operating voltage Vcc. This may be useful, for example, to scale a voltage drop across n-channel device N1 and N2 in FIG. 4 over a range of Vcc. In FIG. 5, dynamic reference voltage source 520 includes a resistor-divider to provide Vref 518 as a fraction or percentage of Vcc. Dynamic reference voltage source 520 may be configured as a cascode reference voltage source.

Figure 6:
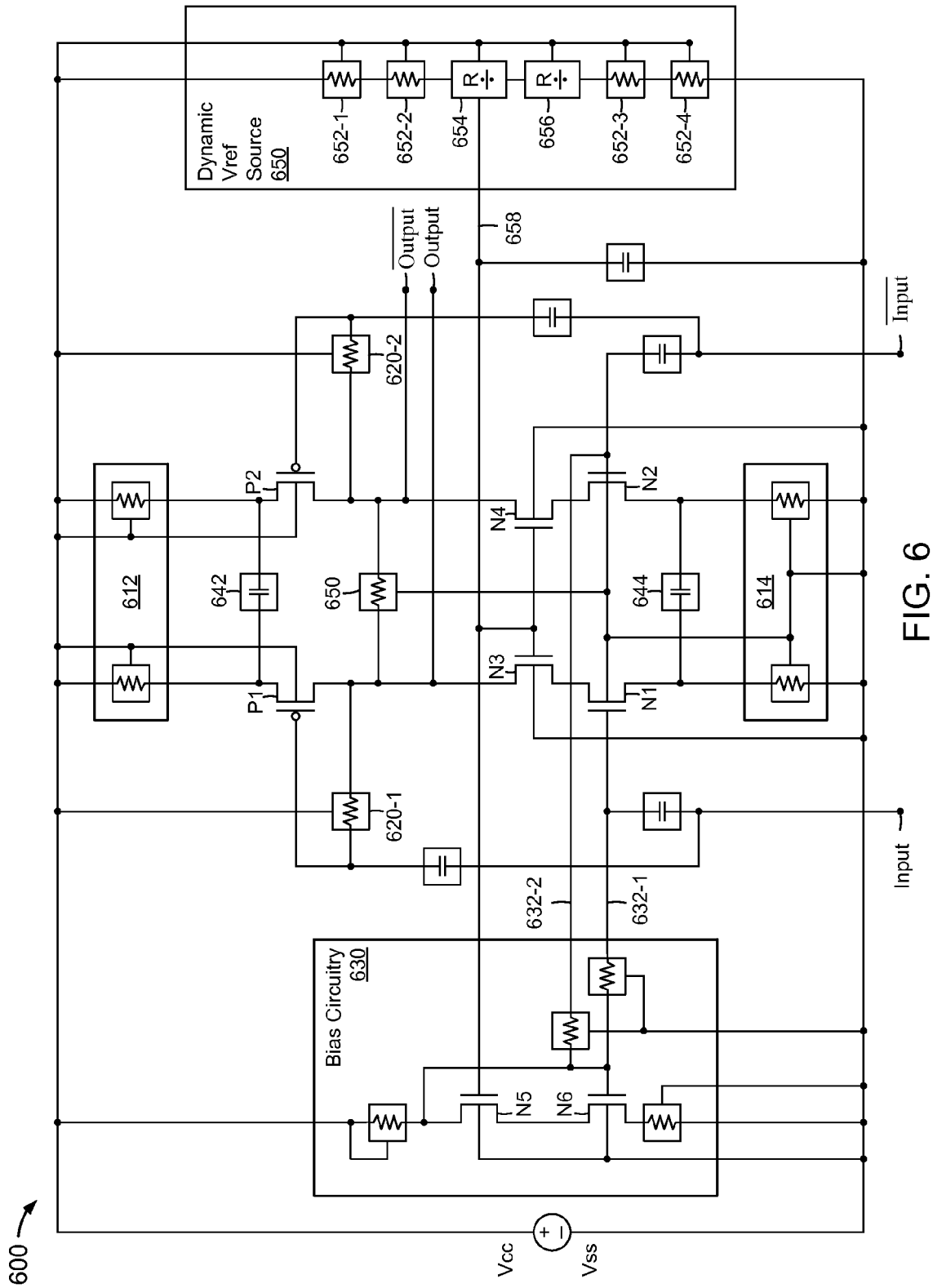
FIG. 6 is another circuit diagram of a differential amplifier.

FIG. 6 is a circuit diagram of a differential amplifier 600, including DC current source 612 with degenerative resistors, DC current sink 614 with degenerative resistors, degenerative capacitors 642 and 644, and resistive negative feedback circuitry 620, such as described above with reference to FIG. 4. Amplifier 600 further includes a dynamic reference voltage source 650 and bias circuitry 630 to provide control voltages 632, such as described above with respect to FIG. 5. In FIG. 6, dynamic reference voltage source 650 includes resistors 652, and resistor dividers 654 and 656. A reference voltage 658 provided from resistor divider 654, may serve as reference voltages Vref-1 and Vref-2 in FIG. 4.

The circuit diagram of FIG. 6 may represent a complimentary metal-oxide-semiconductor (CMOS) embodiment, which may be configured for a RF passband, and which may be manufactured or implemented using an ultra-high speed digital technological process.

Methods and systems disclosed herein may be implemented with respect to one or more of a variety of systems and/or devices, such as described below with reference to FIG. 7. Methods and systems disclosed herein are not, however, limited to the examples of FIG. 7.

Figure 7:
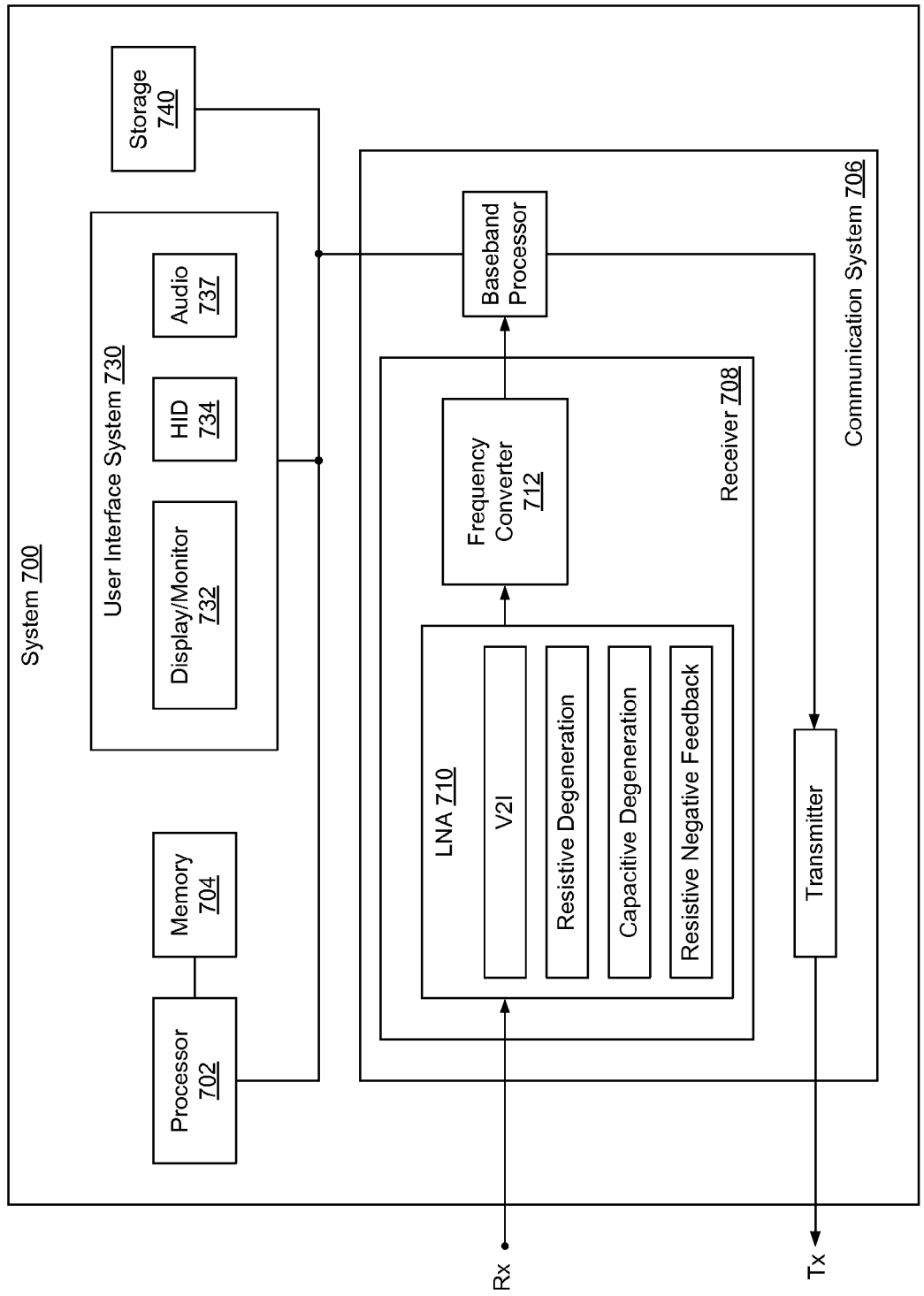
FIG. 7 is a block diagram of a system, including a processor and memory, and a communication system having a low noise amplifier.

FIG. 7 is a block diagram of a system 700, including a processor 702 and associated memory, cache, and/or other local storage medium, illustrated here as memory 704. System 700 further includes a communication system 706 and a user interface system 730.

Communication system 706 may include a wired and/or wireless communication system, and may be configured to communicate with an external communication network on behalf of processor 702 and/or user interface system 730. The external network may include a voice network (e.g., a wireless telephone network), and/or a data or packet-based network (e.g., a proprietary network and/or the Internet).

Communication system 706 includes a receiver 708, which includes a low noise amplifier (LNA) 710 and a frequency down-converter 712. LNA 710 may include a V2I, resistive degeneration, capacitive degeneration, resistive negative feedback, and/or combinations thereof, such as described in one or more examples above. Frequency down-converter 712 may include in-phase and quadrature-phase (I/Q) mixers. Frequency down-converter 712 may include a direct down-converter to down-convert an RF signal from directly to baseband, or a multi-stage (e.g., heterodyne) down-converter.

User interface system 730 may include a monitor or display 732 and/or a human interface device (HID) 734. HID 734 may include, without limitation, a key board, a cursor device, a touch-sensitive device, a motion and/or image sensor, a physical device and/or a virtual device, such as a monitor-displayed virtual keyboard. User interface system 730 may include an audio system 736, which may include a microphone and/or a speaker.

System 700 may further include an electronic or computer-readable storage medium or device, illustrated here as storage 704, which may be accessible to processor 702, communication system 706, and/or user interface system 730.

System 700 may be configured as a stationary or portable/hand-held system, and may be configured as, for example, a mobile telephone, a set-top box, a gaming device, and/or a rack-mountable, desk-top, lap-top, notebook, net-book, notepad, or tablet system, and/or other conventional and/or future-developed system(s). System 700 is not, however, limited to these examples.

An amplifier as disclosed herein may include resistive degeneration to reduce baseband gain, capacitive degeneration to increase passband gain, and resistive negative feedback to compensate for negative input impedance of the capacitive degeneration, such as to provide a real portion of input impedance. Such an amplifier be implemented or manufactured on an integrated circuit chip or die without on-chip or on-die inductors.

Resistive negative feedback may increase a frequency range for which an amplifier operates linearly.

Phase compensation may be provided in conjunction with capacitive degeneration, such as to increase a frequency range for which resistive feedback is negative.

An amplifier as disclosed herein may include a DC current source with resistive degeneration, and may further include a voltage-to-current converter to control output current based on input voltage. This may increase amplifier stability, and may increase a frequency range for which the amplifier operates linearly.

Methods and systems disclosed herein may be implemented in circuitry, including discrete and integrated circuitry, and may be implemented as or within an application specific integrated circuit (ASIC), a domain-specific integrated circuit package, a system-on-a-chip (SOC), a combination of integrated circuit packages, and/or combinations thereof.

EXAMPLES

The following examples pertain to further embodiments.

Example 1 is an apparatus that includes:
a voltage-to-current converter to control an output current based on an input voltage;
resistive degeneration circuitry to reduce baseband gain of the voltage-to-current converter;
capacitive degeneration circuitry to increase passband gain of the voltage-to-current converter; and
impedance control circuitry to compensate for negative input impedance of the capacitive degeneration circuitry.

The apparatus of Example 1 may be implemented or configured as an amplifier.

In an Example 2, the impedance control circuitry of Example 1 is configured to provide a real part of an input impedance of the amplifier.

In an Example 3, the impedance control circuitry of Example 1 or Example 2 is configured to provide a real part of an input impedance of the amplifier.

In an Example 4, the impedance control circuitry of any one of Examples 1-3 includes a transistor-based diode configuration with resistive feedback.

In an Example 5, the impedance control circuitry of any preceding Example includes a resistive feedback path configured to function as a diode as baseband and as a resistive load at passband.

In an Example 6, the resistive feedback path of any one of Examples 3-5 is configured to increase linearity of the voltage-to-current converter.

In an Example 7, the voltage-to-current converter of any preceding Example includes a first voltage-to-current converter to control current from a voltage supply (Vcc) to an output based on an input voltage, and a second voltage-to-current converter to control current to a voltage reference (Vss) from the output based on the input voltage.

In an Example 8, the resistive degeneration circuitry of Example 7 includes first resistive degeneration circuitry coupled between the first voltage-to-current converter and Vcc, and second resistive degeneration circuitry coupled between the second voltage-to-current converter and Vss.

In an Example 9, the second voltage-to-current converter of Example 8 is configured to control to baseband current through the second resistive degeneration circuitry.

In an Example 10, further to any one of Examples 7-9, the first voltage-to-current converter includes a p-channel device to control current from Vcc to the output based on the input voltage, and the second voltage-to-current converter includes an n-channel device to control current from the output to Vss based on the input voltage.

In an Example 11, the second voltage-to-current converter of Example 10 further includes a cascode n-channel device to increase a gain of the second voltage-to-current converter.

In an Example 12, the voltage-to-current converter of any one of Examples 1-6 includes a p-channel device to control current from Vcc to the output based on the input voltage, and an n-channel device to control current from the output to Vss based on the input voltage.

In an Example 13, the resistive degeneration circuitry of Example 12 includes a first resistor coupled between a source node of the p-channel device and Vcc, and a second resistor coupled between a source node of the n-channel device and Vss.

In an Example 14, the impedance control circuitry of Example 12 or Example 13 includes a resistor coupled between a drain and a gate of the p-channel device.

In an Example 15, further to any one of Examples 12-14, the apparatus further includes bias circuitry to control baseband current through the second voltage-to-current converter, and the bias circuitry includes a current mirror to bias the n-channel device with a bias voltage based primarily Vcc and in part on a reference voltage, and a dynamic reference voltage generator to control the reference voltage based on Vcc to scale a gate-to-source voltage of the n-channel device in relation to changes in Vcc.

In an Example 16, the apparatus of Example 15 is configured to provide the input voltage and the bias voltage to a gate of the n-channel device, and further including a resistor to prevent shunting of the input voltage and to filter noise from the bias voltage.

In an Example 17, the voltage-to-current converter of any one of Examples 12-16 wherein the voltage-to-current converter further includes a cascode n-channel device to increase a gain of the n-channel device.

In an Example 18, the apparatus of any preceding Examples is configured as a differential amplifier having differential inputs and differential outputs.

In an Example 19, the voltage-to-current converter of Example 18 includes first and second p-channel devices, each to control current from Vcc to a corresponding one of the differential outputs based on input voltages at a corresponding one of the differential inputs, and first and second n-channel devices, each to control current to Vss from a corresponding one of the differential outputs based on the input voltage at a corresponding one of the differential inputs.

In an Example 20, the resistive degeneration circuitry of Example 19 includes first and second resistors, each coupled between Vcc and a source node of a corresponding one of the p-channel devices, and third and fourth resistors, each coupled between Vss and a source terminal of a corresponding one of the n-channel devices.

In an Example 21, the capacitive degeneration circuitry of Example 20 includes a first capacitor coupled to the source terminals of the p-channel devices, and a second capacitor coupled to the source terminals of the n-channel devices.

In an Example 22, the apparatus of any one of Examples 18-21 further includes a load coupled between the differential outputs, wherein the load includes a configurable resistance to adjust amplifier gain.

In an Example 23, the apparatus of any preceding Example further includes a single-stage down-converter to directly down-convert an output of the amplifier to baseband.

In an Example 24, a system includes a processor and memory, a user interface, and a communication system to interface with a communication network on behalf of one or more of the processor and the user interface, where the communication system includes an amplifier as recited in any preceding Example, to amplify received signals.

In an Example 25, the system of Example 24 is configured as a portable hand-held device.

In an Example 26, the system of Example 24 is configured as a mobile telephone.

In an Example 27, the communication system of any one of Examples 24-26 includes a single-stage down-converter to directly down-convert an output of the amplifier to baseband.

In an Example 28, a method of amplifying a signal includes:
  controlling an output current based on an input voltage with a voltage-to-current converter;
  reducing a baseband gain of the voltage-to-current converter with resistive degeneration;
  increasing passband gain of the voltage-to-current converter with capacitive degeneration; and
  compensating the voltage-to-current converter for negative input impedance of the capacitive degeneration circuitry.

In an Example 29, the compensating of Example 28 includes providing a real part of an input impedance of the amplifier.

In an Example 30, the compensating of Example 28 or Example 29 includes biasing an input of the voltage-to-current converter with resistive negative feedback.

In an Example 31, the compensating of any one of Examples 28-30 includes biasing an input of the voltage-to-current converter with a transistor-based diode configuration with resistive feedback.

In an Example 32, the compensating of any one of Examples 28-31 includes biasing an input of the voltage-to-current converter with resistive feedback circuitry configured to function as a diode as baseband and as a resistive load at passband.

In an Example 33, the feedback of any one of Examples 28-32 is configured to increase linearity of the voltage-to-current converter.

In an Example 34, a communications device is arranged to perform the method of any one of Examples 28-33.

In an Example 35, an apparatus to amplify a signal is configured to perform the method of any one of the Examples 28-33.

In an Example 36, a machine is configured to perform the method of any of Examples 28-33.

In an Example 37, an apparatus includes means for performing the method of any one of Examples 28-33.

In an Example 38, an integrated circuit is configured to perform the method of any one of the Examples 28-33.

Methods and systems are disclosed herein with the aid of functional building blocks illustrating functions, features, and relationships thereof. At least some of the boundaries of these functional building blocks have been arbitrarily defined herein for the convenience of the description. Alternate boundaries may be defined so long as the specified functions and relationships thereof are appropriately performed. While various embodiments are disclosed herein, it should be understood that they are presented as examples. The scope of the claims should not be limited by any of the example embodiments disclosed herein.

What is claimed is:

1. An amplifier, comprising:
  a first voltage-to-current converter to control an output current based on an input voltage;
  a resistive feedback path to bias the first voltage-to-current converter with negative resistive feedback in a transistor-based diode configuration; and
  degeneration circuitry to control a gain of the amplifier, wherein the degeneration circuitry is configured to control a baseband gain of the amplifier to suppress baseband flicker noise;
  wherein the degeneration circuitry includes capacitive degeneration circuitry configured to suppress the baseband flicker noise; and
  wherein the resistive feedback path is configured to compensate for negative input impedance associated with the capacitive degeneration circuitry.

2. The amplifier of claim 1, wherein the capacitive degeneration circuitry is configured to provide a real part of the input impedance.

3. The amplifier of claim 2, wherein one or more of the capacitive degeneration circuitry and the resistive feedback path is configured to extend a frequency band in which one or more of,
  the resistive feedback is negative,
  the capacitive degeneration circuitry provides the real part of the input impedance, and
  the voltage-to-current converter operates linearly.

4. The amplifier of claim 1, wherein the first voltage-to-current converter and the resistive feedback path are configured to function as a diode at baseband and as a resistive load at passband.

5. The amplifier of claim 1, wherein the voltage-to-current converter and the resistive feedback path are configured to function as a non-resonant load at baseband.

6. An amplifier, comprising:
  a first voltage-to-current converter to control an output current based on an input voltage;
  a resistive feedback path to bias the first voltage-to-current converter with negative resistive feedback in a transistor-based diode configuration;
  degeneration circuitry to control a gain of the amplifier, wherein the degeneration circuitry is configured to control a baseband gain of the amplifier to suppress baseband flicker noise; and a second voltage-to-current converter;
wherein the first voltage-to-current converter includes a p-channel device to provide passband current from an operating voltage source to an output based on the input voltage;
wherein the second voltage-to-current converter includes a first n-channel device to provide passband current from the output node to an operating voltage reference based on the input voltage; and
wherein the second voltage-to-current converter further includes a second n-channel device in a cascode arrangement with the first n-channel device to provide the second voltage-to-current converter with a gain equal a gain of the first voltage-to-current converter.

7. The amplifier of claim 6, wherein the amplifier is configured to control a baseband current based on a bias voltage, and wherein the amplifier further includes:
bias circuitry to control the bias voltage based on an operating voltage of the amplifier and a bias reference voltage; and
a dynamic reference voltage generator to vary the bias reference voltage based on variations of the operating voltage.

8. The amplifier of claim 7, wherein the first n-channel device is configured to control the passband current based on the bias voltage, and wherein:
the bias circuitry includes a current mirror to generate the bias voltage from the operating voltage based on the reference voltage; and
the dynamic reference voltage generator includes n-channel devices arranged as a resistive ladder.

9. The amplifier of claim 8, wherein the degeneration circuitry includes resistive degeneration circuitry, and wherein the first n-channel device is configured to control the passband current through the resistive degeneration circuitry.

10. The amplifier of claim 9, wherein the resistive degeneration circuitry includes:
first resistive degeneration circuitry coupled to the first voltage-to-current converter and to the operating voltage source; and
second resistive degeneration circuitry coupled the second voltage-to-current converter and to the operating voltage reference.

11. The amplifier of claim 10, wherein the first resistive degeneration circuitry includes a first resistor coupled to a source node of the p-channel device and to the operating voltage source, and wherein the second resistive degeneration circuitry includes a second resistor coupled to a source node of the first n-channel device and to the operating voltage reference.

12. The amplifier of claim 11, wherein the resistive feedback path includes a resistor coupled to a drain of the p-channel device and to a gate of the p-channel device.

13. The amplifier of claim 8, wherein the first n-channel device is configured to receive the input voltage and the bias voltage at a gate node of the first re-channel device, and wherein the bias circuitry further includes a resistor coupled a node of the bias voltage to prevent shunting of the input voltage and to filter noise from the bias voltage.

14. An amplifier, comprising:
a first voltage-to-current converter to control an output current based on an input voltage;
a resistive feedback path to bias the first voltage-to-current converter with negative resistive feedback in a transistor-based diode configuration;
degeneration circuitry to control a gain of the amplifier, wherein the degeneration circuitry is configured to control a baseband gain of the amplifier to suppress baseband flicker noise;
a second voltage-to-current-converter;
first and second differential inputs; and
first and second differential outputs;
wherein the first voltage-to-current converter includes first and second p-channel devices, each to provide passband current from a respective one of the first and second differential outputs to an operating voltage source based on voltages at respective ones of the first and second differential inputs;
wherein the second voltage-to-current converter includes first and second n-channel devices, each to provide passband current from an operating voltage reference to a respective one of the first and second differential outputs based on voltages at respective ones of the first and second differential inputs; and
wherein the second voltage-to-current converter includes an additional n-channel device in a cascode arrangement with each of the first and second n-channel devices to provide the second voltage-to-current converter with a gain equal a gain of the first voltage-to-current converter.

15. The amplifier of claim 14, wherein the degeneration circuitry includes resistive degeneration circuitry, and wherein the resistive degeneration circuitry includes:
first and second resistors, each coupled to the operating voltage source and to a source node of a respective one of the first and second p-channel devices; and
third and fourth resistors, each coupled to the operating voltage source and a source node of a respective one of the first and second n-channel devices.

16. The amplifier of claim 15, wherein the degeneration circuitry further includes capacitive degeneration circuitry, and wherein the capacitive degeneration circuitry includes:
a first capacitor coupled to the source nodes of the first and second p-channel devices; and
a second capacitor coupled to the source nodes of the first and second n-channel devices.

17. The amplifier of claim 1, further including a load coupled to an output of the amplifier, wherein the load includes a configurable resistance to adjust a gain of the amplifier.

18. A method of amplifying a signal, comprising:
controlling an output current based on an input voltage with a voltage-to-current converter and a resistive feedback path arranged in a transistor-based diode configuration;
biasing the first voltage-to-current converter with negative resistive feedback through the resistive feedback path; and
controlling a gain of the first amplifier with degeneration circuitry, including controlling a baseband gain of the amplifier to suppress baseband flicker noise;
wherein the controlling a baseband gain includes,
suppressing the baseband flicker noise with capacitive degeneration circuitry; and
the biasing includes compensating for negative input impedance associated with the capacitive degeneration circuitry with the negative resistive feedback.

19. The method of claim 18, wherein the compensating includes providing a real part of the input impedance with the capacitive degeneration circuitry.

20. The method of claim 19, further including using one or more of the resistive feedback path and the capacitive degeneration circuitry to extend a frequency band in which one or more of, the resistive feedback is negative, the capacitive degeneration circuitry provides the real part of the input impedance, and the voltage-to-current converter operates linearly.

21. The method of claim 18, wherein the controlling an output current includes operating the voltage-to-current converter and the resistive feedback path as a diode as baseband and as a resistive load at passband.

\* \* \* \* \*